(12) United States Patent
Tian et al.

(10) Patent No.: US 8,313,331 B2
(45) Date of Patent: Nov. 20, 2012

(54) PRINTED CIRCUIT BOARD USED IN SERVER

(75) Inventors: Bo Tian, Shenzhen (CN); Kang Wu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/158,476

(22) Filed: Jun. 13, 2011

(65) Prior Publication Data

US 2012/0270418 A1    Oct. 25, 2012

(30) Foreign Application Priority Data

Apr. 25, 2011    (CN) .......................... 2011 1 0103358

(51) Int. Cl.
*H01R 12/00*    (2006.01)

(52) U.S. Cl. ............................... 439/59; 439/660; 439/55

(58) Field of Classification Search ............. 439/607.32, 439/607.35, 607.39, 607.55, 607.15, 607.16, 439/607.2–607.24, 941, 326, 328, 667, 79, 439/76.1, 540.1, 541.5, 55, 59, 637, 66; 361/737
See application file for complete search history.

(56) References Cited

U.S. PATENT DOCUMENTS

| | | | |
|---|---|---|---|
| 6,752,662 B2 * | 6/2004 | Okamoto | 439/607.04 |
| 7,438,578 B1 * | 10/2008 | Nin et al. | 439/260 |
| 2010/0304611 A1 * | 12/2010 | He et al. | 439/607.01 |

* cited by examiner

*Primary Examiner* — Edwin A. Leon
*Assistant Examiner* — Harshad Patel
(74) *Attorney, Agent, or Firm* — Altis Law Group, Inc.

(57) ABSTRACT

A printed circuit board used in server, which has a golden finger interface at one side thereof. The golden finger interface includes a plurality of parallelly arranged metal sheets which conform to the USB standard. The golden finger interface is used to be engaged with a USB socket for transmitting the electrical signal.

3 Claims, 2 Drawing Sheets

PRINTED CIRCUIT BOARD USED IN SERVER

BACKGROUNDING

1. Technical Field

The disclosure generally relates to printed circuit boards (PCB), and particularly to a PCB used in a server.

2. Description of Related Art

Universal serial bus (USB) is a specification to establish communication between devices and a host controller (such as a server or a personal computer). However, a USB connector is rarely used when the server is working, so a conventional USB connector would increase the cost.

It is desirable to provide a PCB used in server having innovative USB means that can reduce the cost.

DETAILED DESCRIPTION

Figure 1:
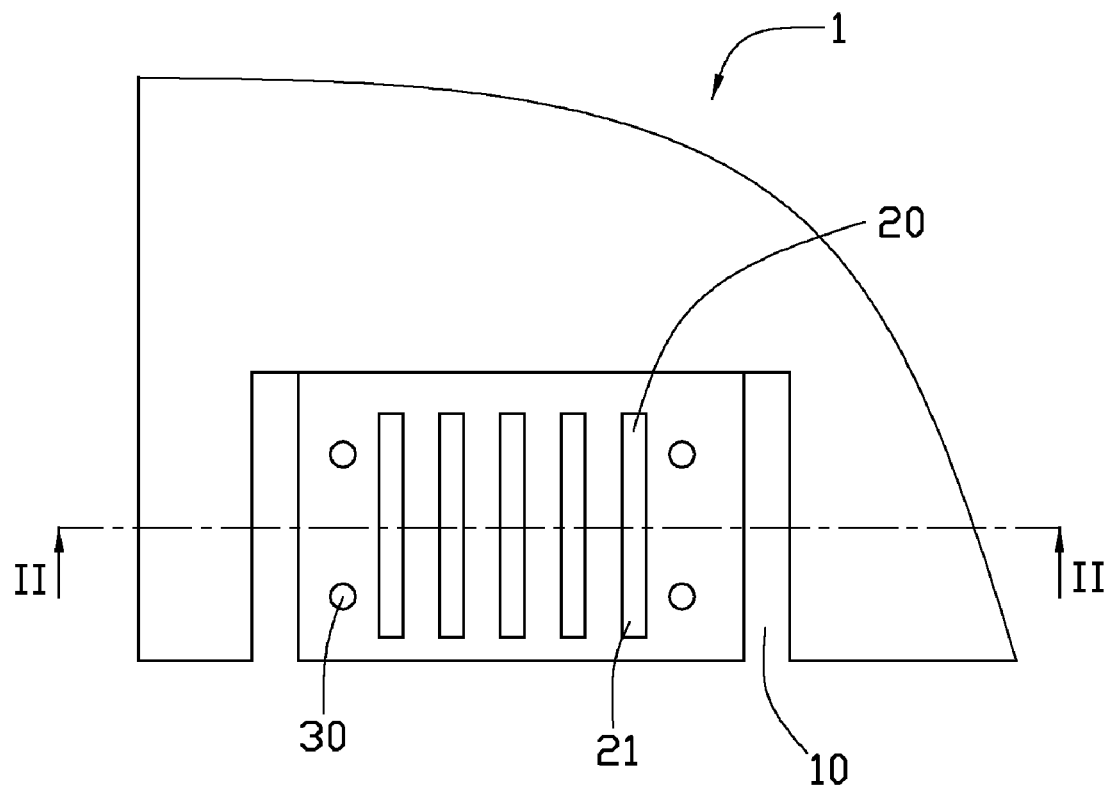
FIG. 1 is a partial, schematic diagram of a first exemplary embodiment of a PCB.
Figure 2:
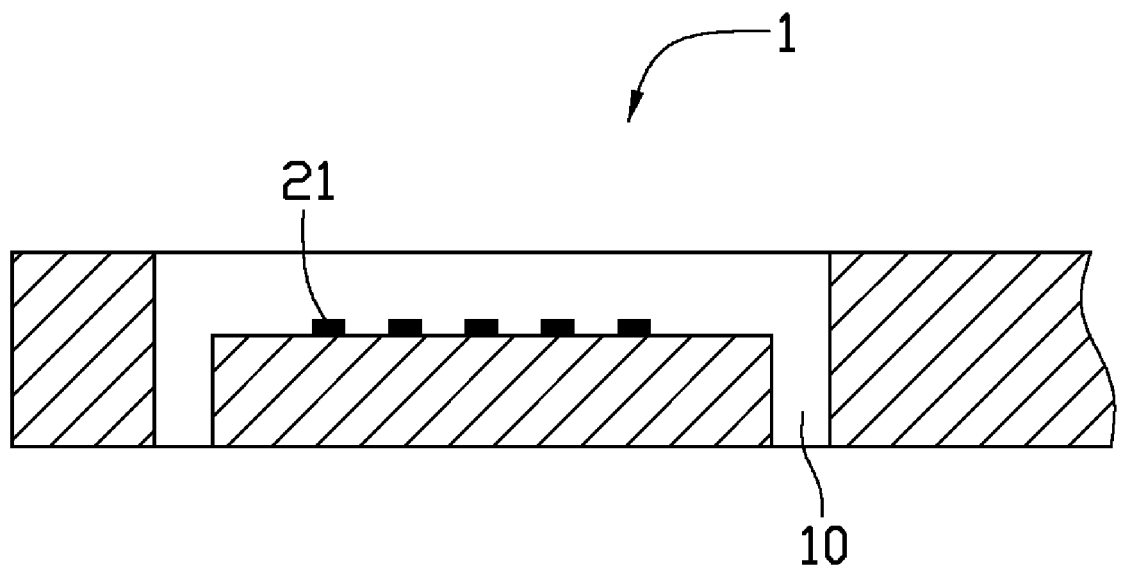
FIG. 2 is a cross section of the PCB of FIG. 1, taken along line II-II thereof.

Referring to FIGS. 1 and 2, a PCB 1 used in a server according to an exemplary embodiment of the disclosure is shown. The PCB 1 can be a four-layer board, six-layer board or ten-layer board.

Two spaced slots 10 are defined at one side of the PCB 1. The two slots 10 are both perpendicular to the side of the PCB 1. The distance between the two slots 10 is equal to a width of a traditional USB socket (not shown). In this embodiment, each of the slots 10 is rectangular. The middle portion of the PCB 1 between the two slots 10 of the PCB 1 is a four-layer board, and the thickness of the middle portion is less than other areas of the PCB 1, so the middle portion can be used to be engaged with the traditional USB socket.

A golden finger interface 20 is positioned between the two slots 10 on the PCB 1. The golden finger interface 20 includes a plurality of parallelly arranged metal sheets 21 which conform to the USB standard, and a length of the metal sheet 21 is shorter than that of the slot 10. The golden finger interface 20 is used to be engaged with the traditional USB socket (not shown) for transmitting the electrical signal.

A plurality of grounding holes 30 are defined at both sides of the golden finger interface 20 in the PCB 1. When the traditional USB socket is engaged with the golden finger interface 20, the electromagnetic interference is reduced thereof. In this embodiment, the grounding holes 30 are circular shaped, certainly, the grounding holes 30 can be other shaped.

Understandably, when the PCB 1 as a whole is a four-layer board, the thickness in the middle of the two slots 10 of the PCB 1 is equal to the other area thereof. It is necessary that the thickness in the middle of the two slots 10 thereof matches with the height of the traditional USB socket. The number of the grounding holes 30 can be changed according to need. And the locations of the grounding holes 30 can also be changed to the other places.

Because the golden finger interface 20 is positioned on the PCB 1 instead of traditional USB connector, the PCB 1 is made simple, used easily at a lower cost.

It is to be understood, however, that even though numerous characteristics and advantages of certain embodiment(s) have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board (PCB), comprising:
   a golden finger interface at one side thereof, the golden finger interface comprising a plurality of parallel arranged metal sheets, and the golden finger interface being used to be engaged with a universal serial bus (USB) socket for transmitting electrical signals; and
   two spaced slots adjacent to the one side, the two slots both perpendicular to the one side, the distance between the two slots being equal to a width of the USB socket, the golden finger interface being positioned between the two slots, and a middle portion of the PCB between the two slots being thinner than other areas of the PCB.

2. The printed circuit board of claim 1, wherein a plurality of grounding holes are defined in the middle portion of the PCB at both sides of the golden finger interface.

3. The printed circuit board of claim 1, being a four-layer board, a six-layer board or a ten-layer board.

* * * * *